United States Patent
Schmid et al.

(10) Patent No.: US 6,417,684 B1
(45) Date of Patent: Jul. 9, 2002

(54) SECUREMENT OF TEST POINTS IN A TEST HEAD

(75) Inventors: Rainer Schmid, Pliezhausen; Klaus Giringer; Ulrich Gauss, both of Herrenberg; Heinz Deusch, Aidlingen, all of (DE)

(73) Assignee: Feinmetall GmbH (DE)

( * ) Notice: Subject to any disclaimer, the term of this patent is extended or adjusted under 35 U.S.C. 154(b) by 0 days.

(21) Appl. No.: 09/173,320

(22) Filed: Oct. 15, 1998

(30) Foreign Application Priority Data

Nov. 5, 1997 (DE) .......................... 197 48 823
Nov. 10, 1997 (DE) .......................... 197 49 456

(51) Int. Cl.⁷ ............................................. G01R 1/073
(52) U.S. Cl. ...................................... 324/761; 324/754
(58) Field of Search ................................. 324/761, 754, 324/755, 72.5; 439/482, 819, 65

(56) References Cited

U.S. PATENT DOCUMENTS

| | | | | |
|---|---|---|---|---|
| 4,027,935 A | * | 6/1977 | Byrnes et al. | 439/65 |
| 4,423,376 A | * | 12/1983 | Byrnes et al. | 324/754 |
| 4,506,215 A | * | 3/1985 | Coughlin | 324/72.5 |
| 4,622,514 A | * | 11/1986 | Lewis | 324/72.5 |
| 4,783,624 A | | 11/1988 | Sabin | 324/158 P |
| 4,814,697 A | | 3/1989 | Krüger | 324/158 |
| 4,931,726 A | * | 6/1990 | Kasukabe et al. | 439/819 |
| 4,963,822 A | | 10/1990 | Prokopp | 324/158 P |
| 5,123,848 A | | 6/1992 | August et al. | 439/66 |
| 5,625,297 A | | 4/1997 | Arnaudov | 324/754 |
| 5,977,787 A | * | 11/1999 | Das et al. | 324/761 |
| 5,990,696 A | * | 11/1999 | Swart | 324/761 |

FOREIGN PATENT DOCUMENTS

| | | |
|---|---|---|
| DE | 3706652 | 10/1987 |
| DE | 9004562.9 | 8/1990 |
| EP | 0068270 | 1/1983 |
| JP | 614971 | 1/1986 |
| JP | 63255671 | 10/1986 |
| JP | 01071141 | 3/1989 |
| JP | 03085456 | 4/1991 |
| JP | 07225245 | 8/1995 |

OTHER PUBLICATIONS

European Search Report dated Dec. 7, 2000.

* cited by examiner

Primary Examiner—Vinh P. Nguyen
(74) Attorney, Agent, or Firm—Ostrolenk, Faber, Gerb & Soffen, LLP

(57) ABSTRACT

A test head for making contact with test points of an electric component under test and with contact points on a board, for example. A plurality of spring elastic, elongated electric contact elements have opposite ends which respectively contact a test point at one end and a contact point at the other end. A plurality of at least two and preferably three guide panels are located in the space between the test points and the contact points. A respective, first, second and third opening in the first, second and third panels for each of the contact elements for each of the contact elements, with two adjacent openings for each of the contact elements being laterally offset and misaligned so that the contact element passing through them is held in a friction locked fashion.

12 Claims, 1 Drawing Sheet

SECUREMENT OF TEST POINTS IN A TEST HEAD

BACKGROUND OF THE INVENTION

The present invention relates to a test head having a device for making contact with test points of an electric component under test, wherein the test points are preferably arranged closely next to one another.

Test heads of the type mentioned here are used to make simultaneous contact with a plurality of test points, arranged one next to the other, of an electric component under test, for example a semiconductor component. The test head comprises a plurality of pin shaped contact elements which are composed of an elastic material and wherein the test points are brought to bear against one assigned test point. The contact force is applied here by folding out and/or bending under spring extension the contact elements in a direction perpendicular to their longitudinal extent when the contact elements are placed on the test points or the test points are placed on the contact elements, respectively. The contact elements are arranged in feed through openings of two guide panels which are spaced apart from one another. The contact elements must be axially movably mounted in the feed-through openings of the guide panels owing to their function. It is desired to prevent a situation in which contact elements which are in the ready-to-operate position of the test head, may drop out of the test head or the feed-through openings, in the direction forced by gravity, for example between two test procedures. DE 23 64 786 suggests providing a support head in the end region of a contact element having external dimensions which are greater than the clear width of the feed through openings. The enlargement of the diameter of the contact elements which is brought about by the support head gives the respective contact element an increased space requirement. The resulting relatively large distance between the contact elements makes it no longer possible to make contact with small test points which are arranged in a very tight space, as is frequently the case with semiconductor components under test, for example.

SUMMARY OF THE INVENTION

It is an object of the present invention to provide a test head in which the contact elements can be arranged closely next to the other and can easily be replaced.

The test head uses a plurality of contact elements, each in the form of an elongate strip of elastic and resilient electrically conductive material and having contact tips at the opposite ends. A test head is used for making contact with test points of an electric component under test and with contact points on a board, for example. A plurality of spring elastic, elongated electric contact elements have opposite ends which respectively contact a test point at one end and a contact point at the other end. A plurality of at least two and preferably three guide panels are located in the space between the test points and the contact points. A respective, first, second and third opening is provided in the first, second and third panels for each of the contact elements, with two respective openings in adjacent panels for each of the contact elements being laterally offset and misaligned so that the contact element passing through them is held in a friction locked fashion.

The test head of the invention guides the contact elements in respective assigned feed through opening of the guide panels for movement in an axially displaceable fashion. Feed through openings of different guide panels assigned to each contact element are arranged laterally offset from and misaligned with respect to one another in such a way that the contact element is held in the panel openings, or at least in one of the openings, in a frictionally locked fashion. The holding forces which act on the contact element result from the frictional engagement between the feed through opening or openings and the contact element arranged therein are so high that in a ready to operate position of the test head, that is, when the contact elements are not bearing against the test points of a component under test, the contact elements are held in the feed-through opening or openings and are reliably prevented from dropping out of the test head under their own weight. The holding forces acting on the contact elements due to frictional engagement are also so small that the contact elements can be displaced in the axial direction during a test procedure. The contact elements fold out and/or bend out under spring extension in the intermediate space between the guide panels in the direction perpendicular, or essentially perpendicular, to their longitudinal extent, and as a result, contact force is applied. The contact elements of the component under test may be arranged close to each other, spaced at a preferably very small distance, so that even the functioning of components for testing, which have small test points which are arranged in a very tight space, can be tested. It is therefore possible to avoid enlarging the diameters of the contact elements in order to hold them on the test head, that is, in the feed through openings of the guide panels. A further advantage of the frictional locking holding of the contact elements is that they can be mounted in a service friendly fashion, making it easy to both introduce them into the test head and to replace them when necessary. For this purpose, each contact element merely has to be pulled out of the respective feed through openings of the guide panels or pressed through them.

In a particularly preferred embodiment of the test head, a third guide panel is arranged in the intermediate space between a first guide panel and a second guide panel of the device for making contact. At least one of the feed through openings assigned to a contact element in one of the panels is laterally offset with respect to the other feed through openings for that contact element in the other guide panels. Preferably, the feed through opening of the third or intermediate guide panel is arranged laterally offset with respect to the respective feed through openings of the first and second guide panels, curving or deforming the contact elements in a defined fashion when the test head is assembled. The folding force is completely eliminated while the frictional engagement is formed between the contact elements and in each case at least one assigned feed through opening of the guide panels. The third guide panel also ensures that the contact elements do not touch one another, particularly during a test procedure, so that, if appropriate, electrical insulation between the contact elements can be dispensed with, and this reduces the cost of the test head.

An embodiment of the test head is preferred in which the free end of each contact elements has a contact tip facing towards and/or facing away from the respective test point. This enables contact to be made with very small test points which are arranged close to each other. The small contact face of the contact tip on a test point makes the surface pressure which is produced relatively large forming a good electrical contact. In a first embodiment variant, the pin-shaped contact elements, which are preferably composed of a spring elastic and resilient material, run to a point or are pointed at one or both free ends to form the contact tip or tips. The respective contact element and its contact tips are therefore of integral construction. In another embodiment, the contact tip is a separate component which is attached to the free end of the contact elements. As a result, contact elements with different shapes and/or different sizes of contact tips can be used individually for each test head, which improves the adaptability of the test head. Irrespective of the design of the contact tip, its greatest diameter or greatest width can be smaller or greater than the diameter of the contact element or else they can correspond. The transition from the contact element to the contact tip is either fluid and continuous or else the transition has at least one shoulder.

Other features and advantages of the present invention will become apparent from the following description of the invention which refers to the accompanying drawings.

DETAILED DESCRIPTION OF THE INVENTION

The test head which is described below is used to test electronic components having test points that are small and are arranged one next to the other. The test head can be used generally, for example, in the field of semiconductors for electrically testing high precision printed circuit boards and semiconductor wafers.

Figure 1:
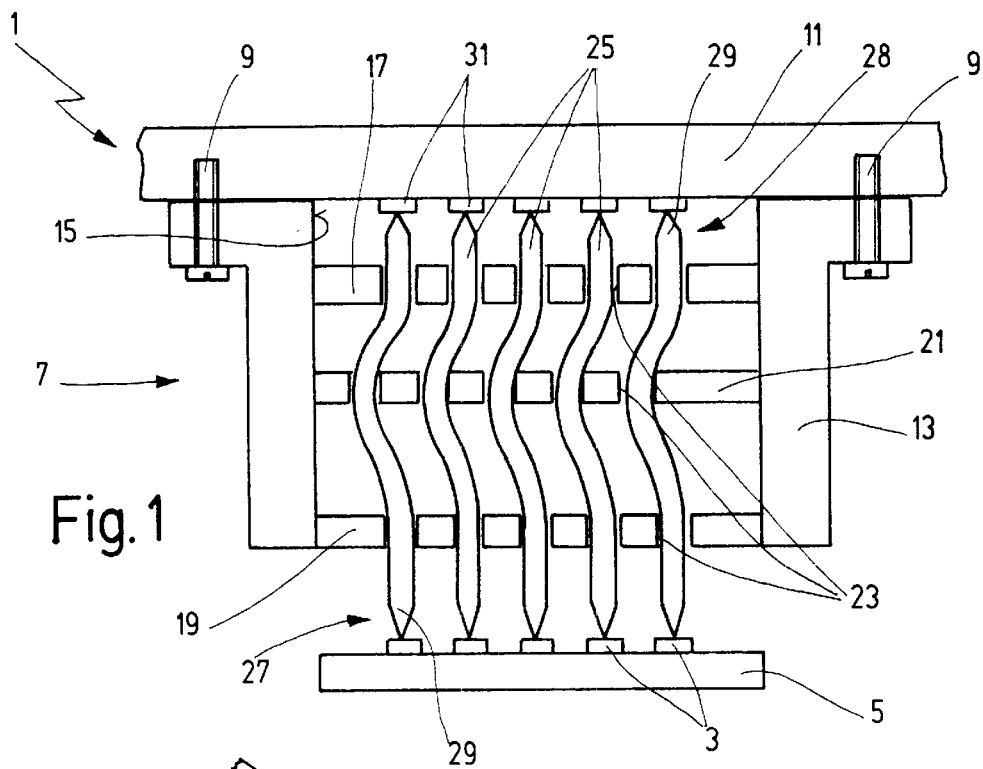
FIG. 1 shows a basic schematic outline of a cross section through a first embodiment of the test head according to the invention.

FIG. 1 is a schematic diagram of a detail of a first embodiment of a test head 1 for making contact simultaneously with a plurality of test points 3, which are arranged next to one another, of an electric component 5 under test. The test head 1 comprises a device 7 for making contact. The device 7 is detachably connected to a printed circuit board 11 of a test unit by attachment means 9, for example, by screws. The test unit is in turn connected to a test device, for example a test voltage source, or the like.

The device 7 for making contact comprises a sleeve shaped base body 13 which has a feed-through hole 15. A first guide panel 17, a second guide panel 19 and a third guide panel 21 are held parallel to one another and at a distance from one another along the axis of the sleeve. Each of the guide panels 17, 19, 21 has several feed through openings 23 through which pin shaped contact elements 25, also referred to as test probes, are axially displaceably guided. The contact elements 25 are composed of an elastic, preferably spring elastic and resilient material, for example spring metal, and are here designed as buckling wires. The guide panels 17, 19, 21 are preferably composed of an electrically non-conductive material, for example a plastic, glass, ceramic, silicon, or the like.

As is clear from FIG. 1, each set of feed through openings 23, assigned to one contact element 25, of the first and second guide panels 17 and 19, respectively, are arranged essentially aligned with one another. In contrast, the respective feed through opening 23 of the third guide panel 21, which is in the intermediate space between the first and second guide panels, is laterally offset from and misaligned with respect to the feed through openings 23 of the guide panels 17, 19. As a result, each contact element 25 arranged in a respective set of feed through openings 23 has a curve in it. Deflecting the contact elements 25 in directions perpendicular to their longitudinal extent causes frictional engagement between the contact elements 25 and the wall of at least one of the respective feed through openings 23 of the guide panels 17, 19, 21. This holds the contact elements 25 exclusively by friction in the base body 13 of the device 7 for making contact. The contact elements 25 are thus reliably prevented from dropping out or slipping out from the feed-through openings 23, e.g., when a test measurement is being performed.

Each contact element 25 has at its free end 27 facing a respective test point 3 of the component under test 5, and also at its free end 28 facing the printed circuit board 11, a contact tip 29 which is formed by a pointed end of the pin shaped contact elements 25. With their free end 28 facing away from the test points 3, the contact element 25 can be pressed against one assigned contact point 31 in each case. The contact points 31 in the embodiment illustrated in FIG. 1 are provided on the printed circuit board 11 of the test unit. The other free ends 27 of the contact elements 25 can be pressed onto respective assigned test points 3 of the component 5 under test.

The operation of the test head 1 is explained below with reference to a test procedure. In the operational position of the device 7 for making contact, which is illustrated in FIG. 1, the contact elements 25 are in contact both with the test points 3 of the component 5 under test and with the contact points 31 on the printed circuit board 11. As a result of a relative movement between the device 7 for making contact and the component 5 under test, the contact elements 25 are axially displaced in the feed through openings 23 of the guide panels 19 and 21. The contact elements 25 which have already been curved by the offset arrangement of the feed through openings of the third guide panel 21 are deflected by the application of pressure in the longitudinal direction against the pin shaped contact elements 25. The resetting forces generated by the elastic properties of the material of the contact elements press the contact elements 25 here with their contact tips 29 in a defined fashion onto the test points 3 of the component 5 under test and onto the contact points 31 of the printed circuit board 21, as a result of which a low electrical contact resistance is achieved. It is then possible to test the continuity of the test points 3 and their insulation with respect to one another, and to test the functioning of the component 5 under test. After the test procedure has been terminated, the device 7 for making contact and the component 5 under test are separated from one another. The deflected/curved contact elements 25 are then displaced automatically back into their initial position because of their inherent elastic properties.

The contact points 31 on the printed circuit board 11 serve as abutments for the contact elements 25. In one embodiment (not illustrated) of the test head, in the ready to operate position of the test head 1, the contact elements 25 are arranged spaced apart from the contact points 31. As a result, to make contact with the test points, the contact elements 25 are initially displaced axially to such an extent that they bear against the contact points 31. Only then is it possible to bend the contact elements 25 further and to thus generate the contact forces which press the contact tips 29 of the contact elements 25 against the respective test points 3 or the respective contact points 31.

The test head 1 embodiment in FIG. 1 is distinguished by a very compact design and a high level W of adaptability to, for example, different components under test and/or test parameters.

Figure 2:
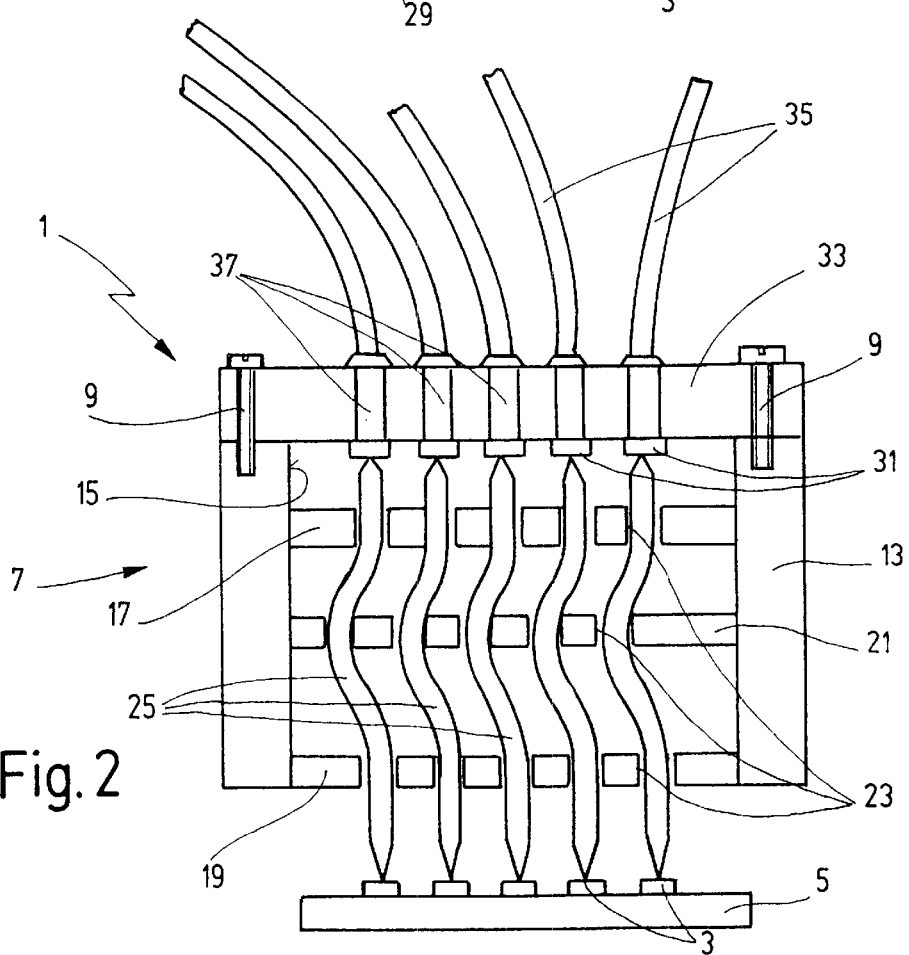
FIG. 2 shows a basic schematic outline of a further embodiment of the test head.

FIG. 2 schematically shows a further embodiment of the test head 1. Components which correspond to those in FIG. 1 have the same reference symbols, so that, in this respect, reference is made to the description relating to FIG. 1. More details are only provided as to the differences.

The device 7 for making contact is connected in a detachable fashion, using the attachment means 9, to a connecting head 33 on which the contact points 31 are located. Those points are each connected to the free end of a line 35, which lines are connected to the test device via plug-type connectors (not illustrated) or directly. The lines 35 are attached, for example they are bonded in, to holes 37 of the connecting head 33.

The embodiments in FIGS. 1 and 2 have in common that the device 7 for making contact can easily be separated from the other components of the test head 1 by detaching the attachment means 9. The contact elements 25 are then accessible from the two openings of the feed through hole 15, which makes it easier to replace individual contact elements 25. Because each contact element 25 is held only by frictional engagement in at least one of the sets of the feed through openings 23 of the guide panels 17, 19, 21, each element 25 can be readily removed from its feed through openings and a new contact element may be easily inserted.

In summary, the test head 1 described with reference to FIGS. 1 and 2 is of simple design and can be manufactured cost effectively, particularly because the contact elements are held only by frictional engagement in the feed through openings of the guide panels or by frictional engagement in the feed through opening of one of the guide panels. The test head can test finely structured components with very small test points and which are arranged at small distances from one another. Good electrical contact both between the contact element and test point and the contact element and contact point is achieved by the pointed contact elements and, respectively, the contact tips of the contact elements, by virtue of the high surface pressure.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A test head for making contact between an electronic component having a plurality of test points and a test circuit having a plurality of contact points, the test head comprising:
   a plurality of contact elements formed of an elastic and electrically conductive material, each contact element having:
      a first and a second end respectively arranged to contact a test point of the electronic component and a contact point of the test circuit when the electronic component and the test circuit are spaced a first distance apart;
   a first guide panel arranged to be spaced from the test points of the electronic component;
   a second guide panel arranged to be spaced from the contact points of the test circuit, and from the first guide panel,
   a plurality of feed-through openings in the first and second guide panels,
      each of the contact elements being threaded through a respective first feed-through opening in the first guide panel and a respective second feed-through opening in the second guide panel,
      the respective first and second feed-through openings being laterally offset and misaligned to an extent that the elastic-material contact elements are held by frictional engagement in at least one of the respective first and second feed-through openings,
      the holding force resulting from the frictional engagement being sufficient that when the contact elements are not bearing against the test points of a component under test, they are reliably prevented from dropping out of the test head under their own weight, but are not prevented from being movable into and out of the feed-through openings for removal or replacement.

2. The test head of claim 1, further comprising:
   a third guide panel spaced from one of the first and second guide panels and from at least one of the feed points and the contact points;
   a respective third guide opening through the third guide panel for each of the contact elements to pass therethrough, the respective third guide opening in the third panel being laterally offset from and misaligned with respect to the guide opening in the adjacent one of the first and second panels, for providing frictional contact between the contact element and at least one of the first, second and third respective openings therefor for frictionally holding the contact element in the openings.

3. The test head of claim 2, wherein the guide panels are arranged in the sequence first, second and third panels, and the first and second openings are misaligned and the second and third openings are misaligned.

4. The test head of claim 3, wherein the first and third openings for each contact element in the respective first and third panels are aligned while the second opening in the second panel for the respective contact element is misaligned with the first and third openings.

5. The test head of claim 3, wherein each of the contact points is connected by an electrical conductor to another device.

6. The test head of claim 3, wherein each contact element is prevented from dropping out of the test head exclusively due to the friction between the contact element and at least one of the first, second and third feed-through openings.

7. The test head of claim 1, wherein each of the contact elements comprises a buckling wire.

8. The test head of claim 1, wherein at least one of the ends of the contact elements includes a respective contact tip.

9. The test head of claim 8, wherein the respective end of the contact element which faces the respective test point is pressable onto the test point.

10. The test head of claim 9, wherein the respective end of the contact element toward one of the contact points can be pressed on the contact point and when pressed upon the test point makes electrical contact between the test point and the contact point.

11. The test head of claim 1, wherein the holding force resulting from the frictional engagement is sufficient that the contact elements may be pressed against the test points of the electronic component and the contact points of the test circuit without shifting through the respective first and second feed-through openings.

12. The test head of claim 1, wherein each contact element is prevented from dropping out of the test head exclusively due to the friction between the contact element and at least one of the first and second feed-through openings.

* * * * *